(12) United States Patent
Sasaki

(10) Patent No.: US 6,800,528 B2
(45) Date of Patent: Oct. 5, 2004

(54) METHOD OF FABRICATING LDMOS SEMICONDUCTOR DEVICES

(75) Inventor: Katsuhito Sasaki, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 51 days.

(21) Appl. No.: 10/368,423

(22) Filed: Feb. 20, 2003

(65) Prior Publication Data

US 2003/0232475 A1 Dec. 18, 2003

(30) Foreign Application Priority Data

Jun. 14, 2002 (JP) ........................................ 2002-174950

(51) Int. Cl.[7] ............................................. H01L 21/336
(52) U.S. Cl. ........................ 438/286; 438/306; 438/529
(58) Field of Search ................................ 438/286, 306, 438/529, FOR 163, FOR 188, FOR 192, FOR 204

(56) References Cited

U.S. PATENT DOCUMENTS

| | | | | |
|---|---|---|---|---|
| 4,626,293 A | * | 12/1986 | Schols | 438/268 |
| 4,818,715 A | * | 4/1989 | Chao | 438/303 |
| 5,427,971 A | * | 6/1995 | Lee et al. | 438/303 |
| 5,677,206 A | * | 10/1997 | Lee et al. | 438/151 |
| 5,854,115 A | * | 12/1998 | Gardner et al. | 438/305 |
| 5,880,015 A | * | 3/1999 | Hata | 438/585 |
| 5,986,305 A | * | 11/1999 | Wu | 257/344 |
| 6,090,676 A | * | 7/2000 | Gardner et al. | 438/303 |
| 6,251,737 B1 | * | 6/2001 | Lee | 438/307 |

FOREIGN PATENT DOCUMENTS

| | | |
|---|---|---|
| JP | 01-125866 | 5/1989 |
| JP | 04-306880 | 10/1992 |
| JP | 07-169974 | 7/1995 |
| JP | 08-097410 | 4/1996 |
| JP | 09-036361 | 2/1997 |

* cited by examiner

Primary Examiner—George Fourson
(74) Attorney, Agent, or Firm—Volentine Francos, PLLC

(57) ABSTRACT

In a method of fabricating an LDMOS semiconductor device, a combined layer including a gate oxide film and a first nitride film is formed on a substrate within a first region. A mask body is formed on the combined layer within a second region that is inside of the first region. Then, first impurities are introduced into the substrate outside of the second region using the mask body as a mask. Next, second impurities are introduced into the substrate outside of the first region using the mask body and the combined layer as a mask. Finally, the introduced first and second impurities are diffused by a heat treatment so as to form a source/drain region and a well region.

22 Claims, 4 Drawing Sheets

METHOD OF FABRICATING LDMOS SEMICONDUCTOR DEVICES

BACKGROUND OF THE INVENTION

The invention relates to a method of fabricating semiconductor devices, particularly to a method of fabricating LDMOS (Lateral Double-Diffused MOS) semiconductor devices.

A LDMOS semiconductor device is generally used by an IC that requires high reliability and has a relatively high voltage when used. An example of the configuration of a conventional LDMOS semiconductor device is disclosed in a literature, i.e., JP A8-97410. The LDMOS semiconductor device disclosed in this reference has an LDMOS configuration wherein a self-aligned channel length is not determined by only heat treatment for forming a deep well (DWELL) region and a source region.

In the conventional techniques set forth above, the gate oxide film is formed after the source region and the DWELL region were formed. Since the concentration of impurities is made high in the order of the substrate, the DWELL region, the source region, there occurs a difference in oxidation speed because of the difference in concentration of impurities. Accordingly, if the oxide film is formed after the DWELL region and the source region were formed on the substrate, there are inevitably formed level differences (Tox1>Tox2>Tox3) between respective gate oxide films of the source region (Tox1), the DWELL region (Tox2) and the NWELL (Tox3). The portion of the oxide film on which these level differences are formed is a gate oxide film region.

If there are portions having different thickness on the gate oxide film region, an electric field distribution is not uniform in the gate oxide film, causing a problem of a reliability in a voltage resistance of the gate oxide film. Particularly, a level difference of the gate oxide film formed over a boundary region between the DWELL and the NWELL has a significant impact on a voltage resistance characteristic of the gate oxide film.

The inventors of this application devoted themselves to study and came to a conclusion that an LDMOS semiconductor device having a gate oxide film which is excellent in voltage resistance characteristics is obtained by forming a DWELL region, a source region and a drain region each having a different concentration of impurities in a substrate using an impurity implantation process, and a heat diffusion process after an oxide film serving as a gate oxide film was previously formed flat and uniform in thickness.

SUMMARY OF THE INVENTION

The invention provides a method of fabricating a semiconductor device capable of uniforming a film thickness of a gate oxide film conventionally formed over a portion in the vicinity of a boundary region between a DWELL and an NWELL but also a film thickness of the gate oxide film, and hence capable of flattening the front surface of the gate oxide film.

According to the method of fabricating an LDMOS semiconductor device of the invention, a combined layer including a gate oxide film and a first nitride film is formed on a substrate within a first region. A mask body is formed on the combined layer within a second region that is inside of the first region. Then, first impurities are introduced into the substrate outside of the second region using the mask body as a mask. Next, second impurities are introduced into the substrate outside of the first region using the mask body and the combined layer as a mask. Finally, the introduced first and second impurities are diffused by a heat treatment so as to form a source/drain region and a well region.

PREFERRED EMBODIMENT OF THE INVENTION

Figure 1A:
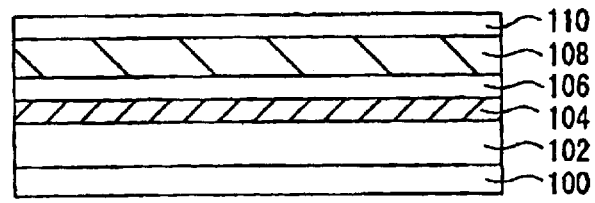
FIG. 1(A) to FIG. 1(D) are process views showing process steps for fabricating an LDMOS semiconductor device according to a first embodiment of the invention.

Preferred embodiments of the invention are described hereinafter with reference to the accompanying drawings. In these figures, dimensions, shapes and arranging relation of each component are merely schematically illustrated to an extent of understanding the invention. Further, numerical conditions of materials to be used, film thickness, implantation energy described hereinafter are nothing but one example within the scope of the invention. Still further, in each figure, same components are depicted by the same reference numerals and the overlapped explanation may be omitted. More still further, hatched portions showing sections or the like are partially omitted.

FIG. 1(A) to FIG. 1(D) and FIG. 2(A) to FIG. 2(E) are process views showing process steps for fabricating an LDMOS semiconductor device, and each figure shows sections of a partial structure body of a semiconductor obtained by each fabricating process. Described hereinafter is an example of the configuration assuming that a first main electrode region is a source region and a second main electrode region is a drain region.

A p-type semiconductor substrate (hereinafter simply referred to as substrate) 100 is first prepared as a second-conduction-type semiconductor substrate. An n-type WELL region (also referred to as NWELL) 102 is formed on the substrate 100 as a diffusion layer in the same manner as a conventional technique. In the following description, the NWELL 102 is assumed to be a substrate. In the NWELL 102, a region between the DWELL and a drain region serves as a drain drift region after the formation of a gate electrode. The NWELL 102 may be formed in the substrate as a diffusion layer or it may be formed on the substrate by epitaxial growth, which is a matter of a design. The substrate 100 and the NWELL 102 provided on the substrate 100 may serve as a substrate.

Subsequently, using a known oxidation technique and a CVD technique, an oxide film 104 in the thickness of 200 Å, a first nitride film 106 in the thickness of 200 Å serving as a first insulating film of oxidation resistance, polysilicon (Poly-Si) film 108 in the thickness of 1200 Å, a second nitride film 110 serving as a second insulating film of oxidation resistance in the thickness of 100 Å are respectively formed uniformly and flat on the substrate (FIG. 1(A)). A partial region of the thus formed oxide film 104 becomes a gate oxide film in the later process.

Figure 1B:
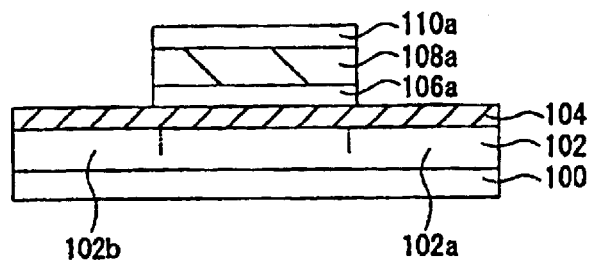

Using a known photolitho-etching technique, the second nitride film 110, the polysilicon film 108 and the first nitride film 106 respectively corresponding to an outside of a predetermined gate electrode region are selectively removed to form a first nitride film 106a, a polysilicon film 108a, and a second nitride film 110a which are island-shaped and have substantially the same shape and size (FIG. 1(B)). That is, the predetermined gate electrode is a region on a substrate surface substantially corresponding to a region between first and second predetermined main electrode regions 102a, 102b formed inside the substrates by the later process when viewed from the above.

Using a known oxidation technique, the oxide film 104 and a part of the polysilicon film 108a on the substrate 100 are oxidized to form oxide films 112a and 112b.

Figure 1C:
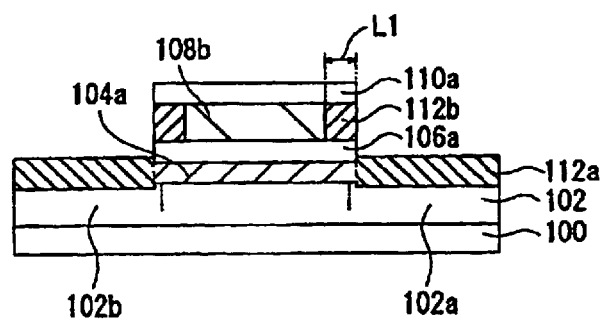
Figure 1D:
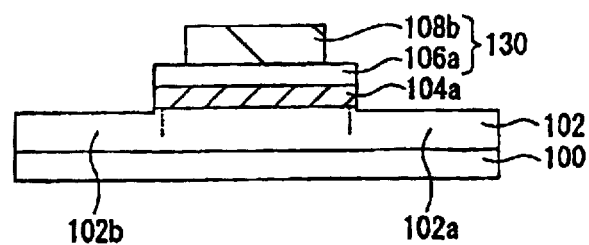

At this time, since the second and first nitride films 110a and 106a formed on the main upper and lower surfaces of the polysilicon film 108a (namely upper surface and lower surface) so that they are not oxidized, and the oxide film (also called as a side surface oxide film) 112b is formed on and only the side surfaces of the polysilicon film 108a to the depth of, e.g. L1=1 to 2 μm in the lateral direction as viewed from the side surface (i.e., horizontal direction) (FIG. 1(C)).

Further, the oxide film 112a is a portion where the previously formed oxide film 104 swells. The central portion of the polysilicon film 108a is not oxidized and remains as a polysilicon film region 108b. Further, a region 104a of the oxide film 104 of the island-shaped first nitride film 106a is not substantially oxidized but remains. A region of the remaining oxide film 104a becomes a gate oxide film, and hence the oxide film 104a is hereinafter referred to as a gate oxide film 104a.

There occurs a slight level difference in a film thickness of the oxide film between the oxide film 104a and the oxide film 112a at a region contacting the edge of the nitride film 106a during the oxidation process. The level difference of the oxide film is markedly smaller than that of a conventional bird's beak in a difference of height.

When the position of a level difference of a mask body having a level difference in film thickness formed during a process after the formation of the gate oxide film is set considering the size and channel length of the semiconductor device to be formed, a boundary region between an NWELL and a DWELL in concern can be formed at a region which is not affected by the level difference of the gate oxide film 104a.

Thereafter, the oxide film 112a, the oxide film oxide film 112b and the second nitride film 110a respectively formed on the substrate 100 and removed by a known etching technique. By the removal of these films, the polysilicon film 108b remains on the central portion of the first nitride film 106a. The island-shaped first nitride film 106a and the remaining portion of the polysilicon film 108b at the central portion of the first nitride film 106a substantially form a mask body 130. The mask body 130 has a thick portion at the central portion and a thin portion at the peripheral portion. The thick portion includes a part of the island-shaped first nitride film 106a and the polysilicon film 108b while the thin portion includes only the island-shaped first nitride film 106a (FIG. 1(D)).

Subsequently, a mask oxide film 114a is formed on the substrate, namely, on the exposed surface of the NWELL 102 in the thickness of about 200 Å by a known oxidation technique. At this time, the exposed surface of the polysilicon film 108b is also oxidized and an oxide film 114b is formed (FIG. 2(A)).

Accordingly, although the oxide film 114b is formed on a part of the inherent mask body 130, even if the example of this configuration forms a mask body including the oxide film 114b, there does not occur any problem for affecting the later processes. A mask body including the oxide film 114b is illustrated as a mask body 130a.

Figure 2A:
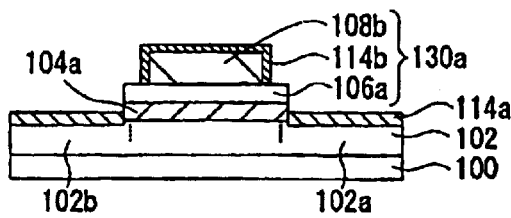
FIG. 2(A) to FIG. 2(E) are process views showing process steps for fabricating an LDMOS semiconductor device and continue from the process steps of FIG. 1(A) to FIG. 1(D) according to the first embodiment of the invention.

Accordingly, the mask body 130a having a level difference in film thickness between the thick portion and the thin portion is formed on the gate oxide film 104a by the first nitride film 106a and the polysilicon film 108b (FIG. 2(A)).

Then, second-conduction-type impurities for the WELL region, i.e., DWELL region are implanted into a first substrate region 103a which is positioned at the side where a first main electrode region is formed relative to the thick portion using the thick portion as a mask.

Accordingly, a resist pattern 116 is formed by a known photolithographic technique so as to bore the predetermined DWELL formation region. The resist pattern 116 covers at least a part of the polysilicon film 108b and is provided as an ion implantation protection film over the NWELL 102 excluding an upside of the region in the NWELL 102 forming a source region, described later. An end edge of the predetermined DWLL formation region of the resist pattern 116 is bored to reach over the thick portion of the mask body 130a which is formed by the polysilicon film 108b and the first nitride film 106a.

Then, p-type impurities 118 such as boron or the like are ion implanted into the NWELL 102 with a dose on the order of 40 keV, 1.0E+14 ions/cm$^2$ using the thick portion of the mask body 130a having a level difference (a region where the first nitride film 106a and the polysilicon film 108b are laminated) and the resist pattern 116 as a mask.

Figure 2B:
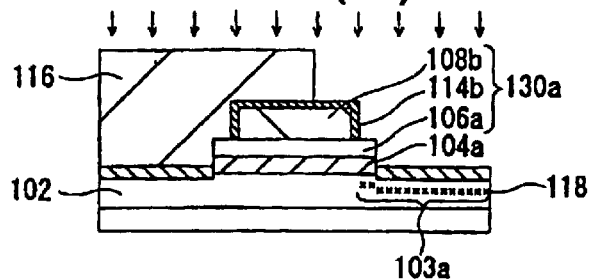

At this time, impurity implantation energy is set such that the impurities pass through the thin portion of the mask body, i.e., laminated film of the first nitride film 106a and the gate oxide film 104a but do not pass through the thick portion of the mask body 130a, i.e., a laminated film of the polysilicon film 108b, the first nitride film 106a and the gate oxide film 104a (FIG. 2(B)).

Subsequently, first-conduction-type impurities are implanted into both a second substrate region 103b which is positioned at the side where the second main electrode region is formed relative to the thin portion, and the first substrate region 103a using the mask body 130a as the mask. The first-conduction-type impurities are those for forming the first and second main electrode regions.

Figure 2C:
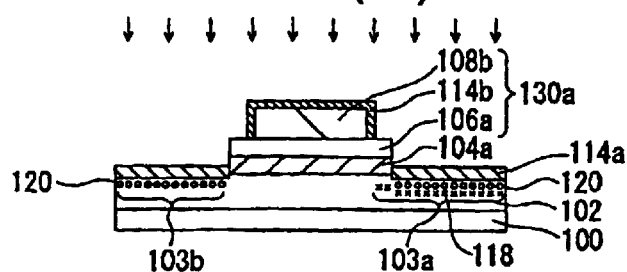

Accordingly, after the resist pattern 116 is removed by a known etching technique, n-type impurities 120 such as As or the like are implanted into the NWELL 102 using the entire mask body 130a having a level difference in film thickness as a mask with a dose on the order of 120 keV, 1.0E+15 ions/cm$^2$ by a known impurity implantation technique (FIG. 2(C)). The implantation level (position) of the n-type impurities 120 is shallower than that of the p-type impurities 118 from the front surface of the NWELL 102.

The impurity implantation energy at this time is set such that the impurities pass through only the mask oxide film 114a outside the mask body 130a.

Figure 2D:
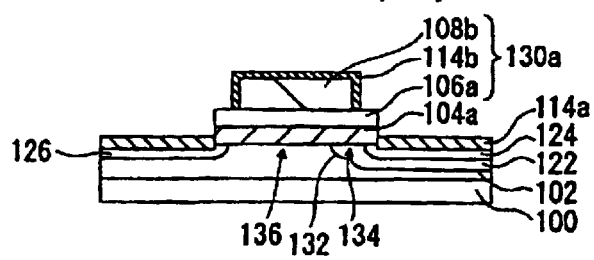

Then, both the p-type impurities 118 and the n-type impurities 120 are subjected to heat diffusion, namely, activated at the same time by a known diffusion technique to form diffusion layers of a DWELL 122, a source region 124 and a drain region 126 (FIG. 2(D)). The DWELL 122 is formed along the source region 124.

An end of a boundary 132 between the DWELL 122 and the NWELL 102 contacts the lower surface of the gate oxide film 104a. The boundary 132 in the vicinity of the front surface of the NWELL 102 and a channel region 134 are positioned under a uniform film thickness portion of the gate oxide film. The NWELL 102 positioned under the gate oxide film 104a between the DWELL 122 and the drain region 126 functions as a drain drift region 136.

The boundary 132 in the vicinity of the front surface of the NWELL 102 between the DWELL 122 and the NWELL 102 is formed at the position which is sufficiently away from the end edge of the gate oxide film 104a at the source region 124 side. Accordingly, even if there occurs a level difference in film thickness at the end edge region of the gate oxide film 104a, boundary between the DWELL 122 and the NWELL 102 can be provided at the position which is not affected by the level difference in film thickness.

Subsequently, the mask oxide film 114a, and oxide film 114b and polysilicon film 108b which remain on the first nitride film 106a are all removed first except for the gate oxide film 104a, using a gas which does not etch the first nitride film 106a by a known etching technique. Then, first nitride film 106a is removed using a gas which does not etch the gate oxide film 104a.

Figure 2E:
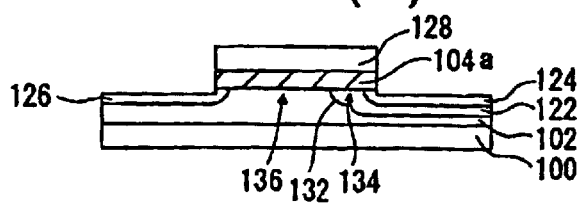

A gate electrode 128 is formed of e.g., polysilicon or the like on the gate oxide film 104a by a known CVD technique (FIG. 2(E)).

Thereafter, an LDMOS semiconductor device is formed by way of a contact formation, a wiring formation, and other given processes. The contact formation and the wiring formation are effected by a known technique, and hence a detailed description thereof is omitted.

As mentioned above, according to the first embodiment of the invention, the p-type impurities are introduced while the impurity implantation energy is set such that they pass through the thin portion of the mask body 130a (first nitride film 106a) and the oxide film (104a, 114a) but do not pass through the thick portion of the mask body 130a (polysilicon film 108b+first nitride film 106a+oxide film 114b) and the gate oxide film 104a, while the n-type impurities are introduced while the impurity implantation energy is set such that they do not pass through the entire mask body 130a but pass through only "the mask oxide film 114a", so that an LDMOS structure having a self-aligned channel length which is not determined by only the heat diffusion of impurities can be realized and also a high reliable gate oxide film in which a level difference in film thickness such as a bird's beak or the like is not substantially formed on the gate oxide film over the channel region.

Further, a position where a boundary of an impurity diffusion region is controlled by a position of the level difference caused by the polysilicon film 108b and the first nitride film 106a and by the difference of impurity implantation energy which are set at respective sides of the level differences can be controlled. Accordingly, the method of the first embodiment forms the LDMOS structure having a channel length which is not determined by only the heat diffusion so that the DWELL is formed at a low temperature, thereby improving the matching with a logic portion (an element on the semiconductor substrate which is used at a low voltage).

Second Embodiment: FIG. 3(A) to FIG. 3(D) and FIG. 4(A) to FIG. 4(D):

FIG. 3(A) to FIG. 3(D) and FIG. 4(A) to FIG. 4(D) are process views showing other process steps for fabricating an LDMOS semiconductor device, and each figure shows sections of a structure body of a semiconductor obtained in each fabricating process.

Even in the second embodiment, it is assumed that first and second-conduction-type semiconductors are n-type, p-type semiconductors, and first and second main electrode regions are source and drain regions.

Steps until an NWELL 202 forming a drain drift region is formed are the same as those in the first embodiment.

Using a known oxidation technique and a CVD technique, an oxide film 204 in the thickness of 200 Å and a polysilicon film 206 in the thickness of 2000 Å are respectively sequentially formed uniformly and flat. Then, impurities 208 such as phosphorous or the like are introduced into the main front surface of the polysilicon film 206 by a known impurity implantation technique (FIG. 3(A)). The impurities 208 are implanted for accelerating oxidation.

Then, an insulating film 210 of oxidation resistance such as a nitride film or the like is formed on the main front surface (upper surface) of the polysilicon film 206.

Patterning is effected so as to remove a portion outside a predetermined gate electrode formation region of the insulating film 210 and the polysilicon film 206 by a known photolitho-etching technique. As a result of the patterning, an insulating film 210a and a polysilicon film 206a which are respectively island-shaped and have substantially the same shape and size remain and are formed (FIG. 3(C)). The foregoing predetermined gate electrode formation region is a region on a substrate surface substantially corresponding to a region between first and second predetermined main electrode regions 202a, 202b which are formed inside the substrate in a later process when viewed from the above.

Figure 3A:
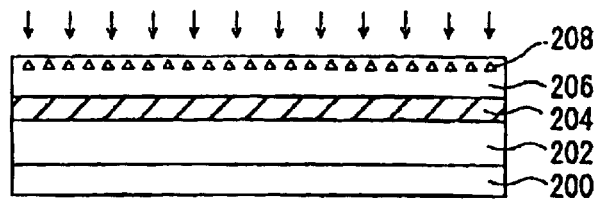
FIG. 3 (A) to FIG. 3(D) are process views showing process steps for fabricating an LDMOS semiconductor device according to a second embodiment of the invention.
Figure 3B:
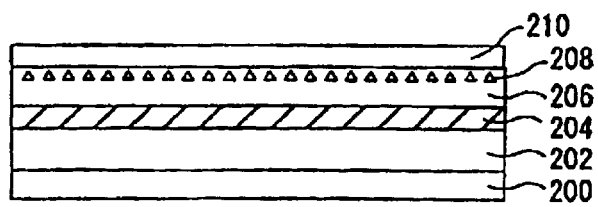
Figure 3C:
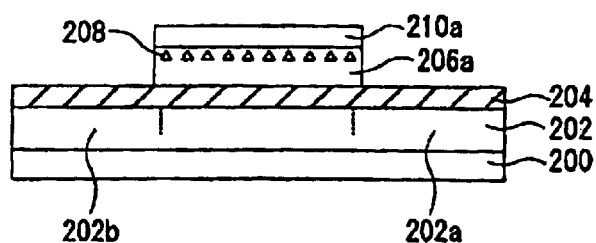
Figure 3D:
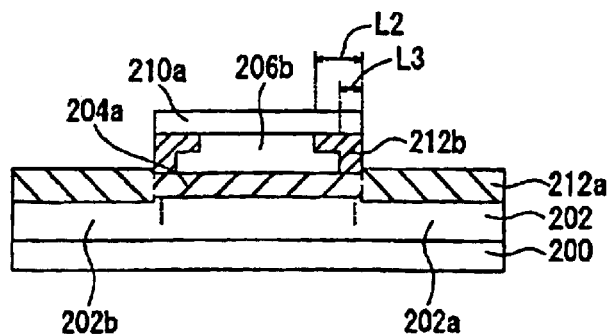

Then, an oxide film 204 on a p-type substrate and a part of the island-shaped polysilicon film 206a are subjected to oxidation process to form oxide films 212a, 212b by a known oxide technique (FIG. 3(D)). At this time, a nitride film 210a is formed on an upper surface, i.e., main front surface of the polysilicon film 206a and the oxide film 204 is formed on the lower surface of the polysilicon film 206a so that the polysilicon film 206a is not oxidized from upper and lower surfaces. Further, since the side surfaces of the polysilicon film 206a are exposed, the polysilicon film 206 is oxidized from the side surfaces. At this time, since the polysilicon film 206a is doped with impurities 208 of high concentration, an oxidation rate is higher than the other portion of polysilicon film 206a. Still further, at this time, an oxide film is formed on the upper surface of the polysilicon film 206a and the side surface in the vicinity of the upper surface in the lateral direction from the side surface, i.e., horizontal direction up to the position of, e.g., L2=1.5 μm while the oxide film is formed on the side surface of the bottom surface of the polysilicon film 206a in the horizontal direction from the side surface up to the position of e.g., about L3=0.7 μm. Meanwhile, the oxide film 212a is a portion where the previously formed oxide film 204 swells as is well known. More still further, although the polysilicon film 206a is oxidized at the side surface and at the upper portion of the side surface, the central portion thereof is not oxidized and remains as polysilicon, i.e., as a polysilicon film 206b. The remaining polysilicon film 206b forms a mask body having a level difference between a thick portion at the central portion and thin portion at the peripheral portion.

The portion of the oxide film 204 positioned under the island-shaped polysilicon film 206a remains as it is in the same manner as described in the first embodiment. The portion of the remaining oxide film 204 becomes the gate oxide film 204. Although there occurs a bird's beak having a slight level difference in height between oxide films 204a and 212a, a boundary region between the NWELL and the DWELL can be formed on a region which is not affected by the level difference of the oxide film such as a bird's beak or the like.

Then second-conduction-type impurities for the WELL, i.e., DWELL are implanted into a first substrate region 203a positioned at the side where the first main electrode is formed relative to the thick portion using the thick portion as a mask.

Figure 4A:
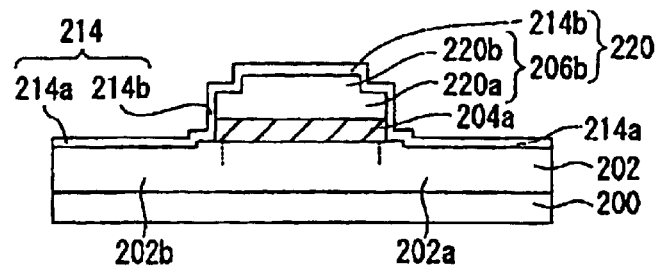
FIG. 4(A) to FIG. 4(D) are process views showing process steps for fabricating an LDMOS semiconductor device and continue from the process steps of FIG. 3(A) to FIG. 3(D) according to the second embodiment of the invention.
Figure 4B:
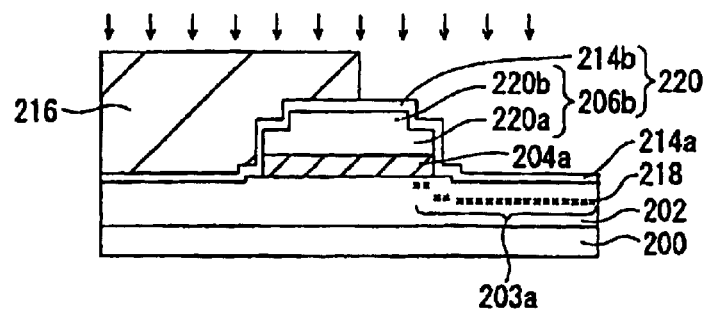
Figure 4C:
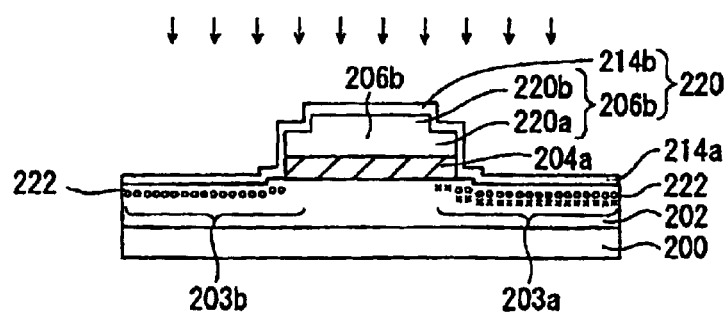

For this purpose, after all the surfaces of the oxide film 212a, 212b and nitride film 210a are removed, a mask oxide film 214 is formed by a known oxide technique (FIG. 4(A)). The mask oxide film 214 is formed on the upper surface of the NWELL 202 as a mask oxide film 214a and also formed on the exposed surface of a polysilicon film 206b as a mask oxide film 214b but even if there is formed a mask body 220 including the oxide film 214b on the upper surface of the polysilicon film 206b, there is substantially no harm for effecting later processes.

Subsequently, a resist pattern 216 for boring the predetermined DWELL formation region is formed as an ion implantation protection film by a known photolithographic technique. At this time, an end edge of the resist pattern 216 at the predetermined DWELL formation region can be set to reach over the thick portion of the polysilicon film 206b.

Subsequently, p-type impurities 218 such as boron or the like is ion implanted into the NWELL 202 with a dose on the order of 40 keV, 1.0E+14 ions/cm$^2$ using the resist pattern 216 and a thick portion 220b of and a mask body 220 as a mask. At this time, impurity implantation energy is set such that the impurities pass through a thin portion 220a of the mask body 220, i.e., a region of a lower portion of the level difference of the polysilicon film 206b, and the gate oxide films 214b, 204a but do not pass through the thick portion 220b of the mask body 220 i.e., a region of an upper portion of the level difference of the polysilicon film 206b, the region of the lower portion of the level difference of the polysilicon film 206b, and the gate oxide films 214b, 204a (FIG. 4(B)).

Then, the first-conduction-type impurities, i.e. n-type impurities are implanted into both a second substrate region 203b positioned at the side where the second main electrode region is formed relative to the thick portion and the foregoing second substrate region 203a using the mask body as a mask.

For that purpose, after the resist pattern 216 is removed by a known etching technique, n-type impurities 222 such as As or the like are implanted into the entire surface of the NWELL 202 with a dose on the order of 120 keV, 1.0E+15 ions/cm$^2$ by a known impurity implantation technique. The impurity implantation energy at this time is set such that the impurities pass through only the mask oxide film 214a (FIG. 4(C). Further, in this case, the n-type impurities 222 are implanted into the NWELL 202 at a level (position) shallower than that of the p-type impurities 218 from the front surface of the NWELL 202.

Figure 4D:
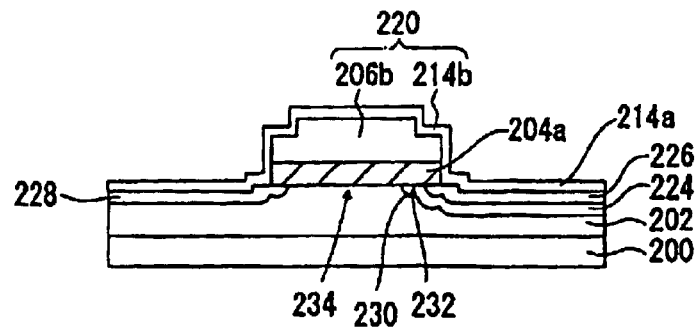

Then, both the p-type impurities 218 and the n-type impurities 222 are subjected to heat diffusion by a known diffusion technique from diffusion layers of a DWELL 224, diffusion layers of a source region 226 and a drain region 228 (FIG. 4(D). The DWELL 224 is formed along the source region 226.

An end of a boundary 230 between the formed DWELL 224 and the NWELL 202 contacts the lower surface of the gate oxide film 204a. A boundary 230 in the vicinity of the front surface of the NWELL 202 and a channel region 232 are positioned under a uniform film thickness portion of the gate oxide film. The NWELL 202 positioned under the gate oxide film 204a between the DWELL 224 and the drain region 228 functions as a drain drift region 234.

After the DWELL 224, the source region 226 and the drain region 228 were formed as a diffusion layer, the polysilicon film 206b formed as a mask body remains as a gate electrode as it is. In this case, the oxide film 214b on the front surface of the gate electrode may be removed, if necessary.

Thereafter, the resultant structure body is subjected to contact formation, wiring formation and other processes, thereby forming an LDMOS semiconductor device. Meanwhile, the contact formation and the wiring formation are effected by a known technique, and hence the explanation thereof is omitted.

According to the second embodiment of the invention, the p-type impurities are introduced while the impurity implantation energy is set such that they pass through the thin portion of the mask body 220 (lower portion of the level difference of the polysilicon film 206b) and the oxide film (214b, 214a) but do not pass through the thick portion of the mask body 220 (upper portion of the level difference of the polysilicon film 206b+lower portion of the level difference of the polysilicon film 206b) and the gate oxide film (214b, 214a), while the n-type impurities are introduced while the impurity implantation energy is set such that they pass through only the mask oxide film 214a, so that an LDMOS structure having a channel length which is not determined by only the heat diffusion of impurities and self-aligned can be realized, and also since a level difference such as a bird's beak or the like is not formed on the gate oxide film over the channel region, a high reliable gate oxide film can be provided in the same effects as those set forth in the first embodiment.

Further, the polysilicon film 206b which is used as a mask when the p-impurities and n-impurities are introduced is used as a gate electrode, a mask process can be reduced, thereby simplifying process steps.

Further, the DWELL, the source and drain regions are formed using the gate electrode as a mask so that the alignment displacement between the gate electrode, the DWELL, the source and drain regions is not needed to be considered, thereby reducing the size of each element.

Although the first and second embodiments describes the application to the n-type LDMOS in detail, the method of the invention can be also applied to a p-type LDMOS.

If it is possible to provide the DWELL at the drain region side, the first main electrode region may be formed as a drain region and the second main electrode region may be formed as a source region.

As is evident from the foregoing embodiments, according to the method of fabricating the LDMOS semiconductor device of the invention, the DWELL region, the source and drain regions are formed in the substrate using the impurity implantation process and the heat diffusion process after the uniform and flat gate oxide film was formed in advance. Accordingly, a film thickness of the gate oxide film per se has no substantial level difference. Further, a boundary in the vicinity of the substrate surface between the substrate region and the DWELL region is formed at a spot under the gate oxide film having a uniform film thickness which is away from an end edge of the gate oxide film.

Still further, even if there occurs a slight level difference in height at the end edge region of the gate oxide film, a boundary region between the DWELL and the NWELL in concern can be provided at a region which is not affected by the level difference of the gate oxide film by setting the position of a level difference of the mask body having a level difference in thickness which is formed at a process after the formation of the gate oxide film considering the size and channel length of the semiconductor device.

As a result, according to the LDMOS semiconductor device of the invention, the LDMOS semiconductor device having a channel length which is not determined by only heat diffusion can be fabricated as a device having a gate oxide film which is stable in electric field distribution therein and is more improved in voltage resistance characteristics thereof compared with the conventional LDMOS semiconductor device.

What is claimed is:

1. A method of fabricating an LDMOS semiconductor device comprising:

forming a combined layer on a substrate within a first region, the combined layer including a gate oxide film and a first nitride film;

forming a mask body on the combined layer within a second region that is inside of the first region;

introducing first impurities into the substrate outside of the second region using the mask body as a mask;

introducing second impurities into the substrate outside of the first region using the mask body and the combined layer as a mask; and diffusing the introduced first and second impurities by a heat treatment so as to form a source/drain region and a well region.

2. A method of fabricating an LDMOS semiconductor device according to claim 1, further comprising:

removing the mask body and the first nitride layer after diffusing so that the gate oxide film is exposed; and forming a gate electrode on the exposed gate oxide film.

3. A method of fabricating an LDMOS semiconductor device according to claim 1, wherein the mask body includes a polysilicon layer and an oxide layer formed on the combined layer.

4. A method of fabricating an LDMOS semiconductor device according to claim 1, wherein forming the combined layer and the mask body includes forming the gate oxide film, the first nitride layer, a polysilicon layer and a second nitride layer on the substrate in order;

selectively removing the first nitride layer, the polysilicon layer and the second nitride layer so that the first nitride layer, the polysilicon layer and the second nitride layer remain within the first region;

oxidizing the structure after said selectively removing so that the gate oxide outside of the first region and a peripheral region of the polysilicon layer within the first region are oxidized;

removing the second nitride layer, the oxidized peripheral region of the polysilicon layer and the oxidized gate oxide outside of the first region, so that the polysilicon layer is exposed; and forming an oxide layer on the exposed polysilicon layer.

5. A method of fabricating an LDMOS semiconductor device according to claim 1, wherein the first and second impurities are simultaneously diffused.

6. A method of fabricating an LDMOS semiconductor device according to claim 1, wherein the first impurities are diffused deeper than the second impurities.

7. A method of fabricating an LDMOS semiconductor device according to claim 1, wherein the substrate has a first conductivity type, the first impurities have a second conductivity type and the second impurities have the first conductivity type.

8. A method of fabricating an LDMOS semiconductor device according to claim 1, wherein the substrate has a first conductivity type and has a layer region having a second conductivity type;

the first impurities are introduced in the layer region and have the first conductivity type; and the second impurities are introduced in the layer region and have the second conductivity type.

9. A method of fabricating an LDMOS semiconductor device comprising:

forming a gate oxide film on a substrate within a first region;

forming a polysilicon layer on the gate oxide film, the polysilicon layer having a first thickness at a peripheral region within the first region and having a second thickness that is thicker than the first thickness within the first region excluding the peripheral region;

introducing first impurities into the substrate outside of the first region and within the peripheral region, using a part of the polysilicon layer having the second thickness as a mask;

introducing second impurities into the substrate outside of the first region using the polysilicon layer as a mask; and diffusing the introduced first and second impurities by a heat treatment so as to form a source/drain region and a well region, wherein the source/drain region is formed entirely within the well region.

10. A method of fabricating an LDMOS semiconductor device according to claim 9, further comprising:

removing the polysilicon layer after diffusing so that the gate oxide film is exposed; and forming a gate electrode on the exposed gate oxide film.

11. A method of fabricating an LDMOS semiconductor device according to claim 9, wherein the polysilicon layer is covered by an oxide layer.

12. A method of fabricating an LDMOS semiconductor device according to claim 9, wherein said forming the gate oxide film and said forming the polysilicon layer includes forming the gate oxide film, the polysilicon layer and a nitride layer on the substrate in order;

introducing third impurities into a top portion of the polysilicon layer;

selectively removing the polysilicon layer and the nitride layer so that the polysilicon layer and the nitride layer remain within the first region;

oxidizing the structure after said selectively removing so that the gate oxide outside of the first region, and side surfaces and a top surface of the peripheral region of the remaining polysilicon layer are oxidized;

removing the nitride layer, the oxidized polysilicon layer and the oxidized gate oxide outside of the first regions so that the polysilicon layer is exposed; and forming an oxide layer on the exposed polysilicon layer.

13. A method of fabricating an LDMOS semiconductor device according to claim 9, wherein the first and second impurities are simultaneously diffused.

14. A method of fabricating an LDMOS semiconductor device according to claim 9, wherein the first impurities are diffused deeper than the second impurities.

15. A method of fabricating an LDMOS semiconductor device according to claim 9, wherein the substrate has a first conductivity type, the first impurities have a second conductivity type and the second impurities have the first conductivity type.

16. A method of fabricating an LDMOS semiconductor device according to claim 9, wherein the substrate has a first conductivity type and has a layer region having a second conductivity type;

the first impurities are introduced in the layer region and have the first conductivity type; and the second impurities are introduced in the layer region and have the second conductivity type.

17. A method of fabricating an LDMOS semiconductor device comprising:

forming a gate oxide film on a substrate surface corresponding to first and second main electrode regions that are to be formed inside a first-conduction-type substrate to be away from each other;

forming a mask body on the gate oxide film, said mask body comprised of a thick portion at a central portion thereof and a thin portion at a peripheral portion thereof;

implanting second-conduction-type impurities for a WELL region into a first substrate region positioned at a side where the first main electrode region is formed relative to the thick portion, using the thick portion of the mask body as a mask;

implanting first-conduction-type impurities for the first and second main electrode regions into both a second substrate region positioned at a side where the second main electrode region is formed relative to the thick portion of the mask body and the first substrate region using the mask body as a masks at an implanting level which is shallower than an implanting level of the second-conduction-type impurities; and forming the first and second main electrode regions of a first-conduction-type by subjecting both the first and second-conduction-type impurities to heat diffusion at a same time, and forming the WELL region of a second-conduction-type along the first main electrode region.

18. A method of fabricating an LDMOS semiconductor device according to claim 17, wherein forming the mask body comprises:

forming a nitride film on the gate oxide film; and forming a polysilicon film over a central portion of an upper surface of the nitride film, wherein the thick portion of the mask body is formed of a laminated film comprised of the nitride film and the polysilicon film, and the thin portion of the mask body is formed of an exposed portion of the nitride film at a periphery of the polysilicon film.

19. A method of fabricating an LDMOS semiconductor device according to claim 17, wherein forming the mask body comprises forming polysilicon on the gate oxide film.

20. The method of fabricating an LDMOS semiconductor device according to claim 17, wherein forming the mask body comprises:

forming polysilicon film on the gate oxide film;

implanting impurities for accelerating oxidation into an upper surface of the polysilicon film;

forming a nitride film on the polysilicon film into which the impurities were implanted;

oxidizing the polysilicon film from a side surface thereof; and removing the nitride film and the oxidized polysilicon film.

21. A method of fabricating an LDMOS semiconductor device according to claim 1, wherein the source/drain region and the well region have respectively different conductivity type.

22. A method of fabricating an LDMOS semiconductor device according to claim 9, wherein the source/drain region and the well region have respectively different conductivity type.

* * * * *